United States Patent [19]

Egawa et al.

[11] Patent Number: 4,688,870
[45] Date of Patent: Aug. 25, 1987

[54] SOCKET FOR ELECTRONIC DEVICE

[75] Inventors: Yoshinori Egawa, Hachiohji; Nakano Hidetaka, Tokyo, both of Japan

[73] Assignee: Yamaichi Electric Mfg. Co., Ltd., Tokyo, Japan

[21] Appl. No.: 913,304

[22] Filed: Sep. 30, 1986

[30] Foreign Application Priority Data

Oct. 2, 1985 [JP] Japan .......................... 60-151355[U]

[51] Int. Cl.⁴ .......................................... H01R 13/62
[52] U.S. Cl. ........................................ 439/331; 439/70
[58] Field of Search ............ 339/17 CF, 74 R, 75 M, 339/75 MP

[56] References Cited

U.S. PATENT DOCUMENTS

| | | | |
|---|---|---|---|
| 3,663,920 | 5/1972 | Lapham et al. | 339/75 MP |
| 3,719,917 | 3/1973 | Fischer et la. | 339/17 CF |
| 3,874,768 | 4/1975 | Cutchaw | 339/17 CF |
| 4,026,412 | 5/1977 | Henson | 339/17 CF |
| 4,402,561 | 9/1983 | Grabbe et al. | 339/17 CF |
| 4,547,031 | 10/1985 | Korsuwsky | 339/17 CF |
| 4,583,806 | 4/1986 | Tainter, Jr. et al. | 339/17 CF |

FOREIGN PATENT DOCUMENTS 2423623 11/1975 Fed. Rep. of Germany ... 339/17 CF

Primary Examiner—John McQuade
Attorney, Agent, or Firm—Wenderoth, Lind & Ponack

[57] ABSTRACT

A socket for an electronic device having leads projecting laterally therefrom comprises a socket substrate having grooves formed on one surface thereof for accommodating the leads therein and also having contacts which are plate members punched out of a strap of plate and bent in a substantially L-shape with a fold in the widthwise direction and each composed of a first plate strip and a second plate strip with the fold as a boundary, the first plate strip having one surface laid along and supported on the bottom of the groove to thereby serve as a rigid contact, the second plate strip being implanted from the bottom of the groove in the socket substrate to project downwardly from the lower surface of the socket substrate and serve as a male terminal, and a cover being superposed on and fixed with fastening means to the socket substrate and having resilient pressure strips each resiliently clamping, in cooperation with the other surface of the first plate strip, the lead of the electronic device accommodated in the groove of the socket substrate.

3 Claims, 4 Drawing Figures

SOCKET FOR ELECTRONIC DEVICE

FIELD OF THE INVENTION AND RELATED ART STATEMENT

The present invention relates to a socket for an electronic device such as an IC package, semiconductor device, etc., which comprises a socket substrate having contacts and a cover having resilient pressure strips and is adapted to clamp leads of the electronic device between the contacts and the resilient pressure strips.

In a conventional socket of this type, pressure of contact between contacts of a socket substrate and leads projecting sideways from an IC package is obtained by putting the leads on the contacts and, in this state, closing the socket substrate with a cover so as to press the cover on the socket substrate. To obtain the contact pressure, there have widely been used contacts of a type comprising laterally U-shaped contact pieces and leg pieces integral with the contact pieces and implanted in the socket substrate. Use of such U-shaped contact pieces makes signal paths long to thereby increase inductive reactance and capacitive reactance and results in a possible phenomenon of high frequency signals being delayed. Further, since the bent portions of the laterally U-shaped contact pieces on which the leads are put are liable to be uneven in height, the levels of the leads on the contact pieces are not uniform. Furthermore, since the conventional socket has a construction such that the leads are put on the free ends of the laterally U-shaped resilient contact pieces projecting from upper openings of contact accommodating grooves and, in this state, that pads etc. projecting from the inner surface of the cover are pressed against the leads put on the contact pieces to obtain pressure of contact between the contact pieces and the leads, the putting operation of the leads on the contact pieces is unstable, thereby making the workability inferior. In addition, partition walls defining the contact accommodating grooves have to become higher at a portion thereof at which the free ends of the laterally U-shaped contact pieces are located than at the other portions thereof. This runs counter to a recent technical tendency to mold leads of a minute pitch.

OBJECT AND SUMMARY OF THE INVENTION

The main object of the present invention is to provide a socket for an electronic device, in which leads of the electronic device can stably be put on contacts of the socket, resilient pressure is applied from a cover of the socket to obtain proper pressure contact between the leads and the contacts, the length of the contacts for passage of signals is made as small as possible to effectively prevent an undesirable phenomenon of increase in inductive reactance and capacitive reactance from occurring, the height of partition walls defining contact accommodating grooves is made as small as possible to solve the problem of difficult molding of a socket substrate and make it possible to reduce the thickness of the socket substrate, and the contacts united with a common retainer are punched out of a strip of plate to have their contact plate surfaces flush with one another can be implanted in a lump in the socket substrate without giving deformation or the like disadvantages thereto.

To attain the object described above, according to the present invention, there is provided a socket for an electronic device having a plurality of leads projecting laterally therefrom, comprising in combination a socket substrate having grooves formed on one surface thereof for accommodating therein the leads and also having contacts which are plates members punched out of a strap of plate and bent in a substantially L-shape with a fold in the widthwise direction and each composed of a first plate strip and a second plate strip with the fold as a boundary, the first plate strip having one surface laid along and supported on a bottom of corresponding one of the grooves to thereby serve as a rigid contact, the second plate strip being implanted from the bottom of the groove in the socket substrate to project downwardly from the lower surface of the socket substrate and serve as a terminal, and a cover being superposed on and fixed to the socket substrate with fastening means and having resilient pressure strips each resiliently clamping, in cooperation with the other surface of the first plate strip, corresponding one of the leads of the electronic device accommodated in the grooves of the socket substrate, whereby pressure of contact between the leads of the electronic device and the contacts of the socket substrate is obtained.

The above and other objects, characteristic features and advantages of the present invention will become apparent to those skilled in the art as the disclosure is made in the following description of preferred embodiments of the invention, as illustrated in the accompanying drawings.

DETAILED DESCRIPTION OF THE PREFERRED EMBODIMENTS

The present invention will now be described in detail with reference to the illustrated embodiments.

Figure 1:
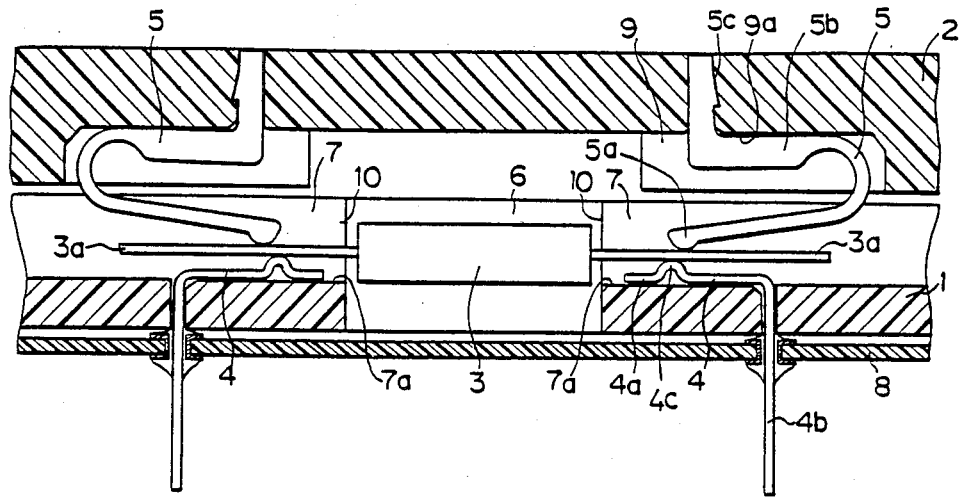
FIG. 1 is a partially cutaway cross-sectional view illustrating one embodiment of the socket for an electronic device according to the present invention in a state of closing a socket substrate with a cover.

FIG. 1 is a partially cutaway cross-sectional view illustrating one embodiment of the socket for an electronic device according to the present invention. In FIG. 1, reference numeral 1 designates a socket substrate, numeral 2 a cover, and numeral 3 an electronic device having leads 3a projecting laterally therefrom. The socket substrate 1 is provided with contacts 4, and the cover 2 is provided with resilient pressure strips 5. Each of the contacts 4 and each of the resilient pressure strips 5 are disposed so as to face each other when the socket substrate 1 and the cover 2 are closed together by known lock means (not shown). The socket substrate 1 has a compartment 6 for accommodating therein the electronic device 3 and also has grooves 7 extending straight on the upper surface thereof from the compartment 6 and defined by partition walls 10 for accommodating therein the leads 3a of the electronic device 3.

The contacts 4 are elongate plate members of a uniform width punched out of a strap of metal plate and are each bent substantially at right angles into a substantially L-shape with a fold in the widthwise direction thereof and composed of a first plate strip 4a and a second plate strip 4b with the fold as a boundary. The first plate strip 4a of the contact 4 is disposed to have its free end directed to the compartment 6, laid along the groove 7 and supported on and in contact with the bottom 7a of the groove 7 so as to serve as a rigid contact. The first plate strip 4a as the rigid contact has its plate surface kept over its entire length in intimate contact with the bottom 7a of the groove 7 so as not to be resiliently displaced in the downward direction but to withstand the pressure applied by the resilient pressure strip 5 of the cover 2. Thus, the first plate strip 4a functions as a rigid contact. On the other hand, the second plate strip 4b of the contact 4 is implanted from the bottom 7a of the groove 7 in the socket substrate 1 so as to project downwardly from the lower surface of the socket substrate 1 and serve as a male terminal, and is inserted into a hole bored in a printed circuit board 8 and fixed by soldering or the like treatment to the printed circuit board 8 at the hole.

The resilient pressure strips 5 of the cover 2 are laterally U-shaped and are each composed of a resilient portion 5a and a seat portion 5b forming a substantially U-shape in conjunction with each other and a leg portion 5c integral with and disposed substantially at right angles relative to the seat portion 5b. The cover 2 has grooves 9 formed on the inner surface thereof for admitting the resilient pressure strips 5. The bottom 9a of the groove 9 of the cover 2 and the bottom 7a of the groove 7 of the socket substrate 1 face each other when the cover 2 and the socket substrate 1 are closed together. The leg portion 5c of the resilient pressure strip 5 is implanted from the bottom 9a of the groove 9 in the cover 2, the seat portion 5b thereof is accommodated within the groove 9 and kept in intimate contact with the bottom 9a of the groove 9, and the resilient portion 5a thereof has its free end extending in the same direction as that of the first plate strip 4a of the contact 4 when the cover 2 and the socket substrate 1 are closed together.

The electronic device 3 is accommodated within the compartment 6 of the socket substrate 1 while the leads 3a of the electronic device 3 are accommodated in the groove 7 of the socket substrate 1. At this time, the leads 3a are put on the first plate strips 4a of the contacts 4 with a substantially parallel relationship therebetween and are disposed near the bottoms 7a of the grooves 7. In this state, the socket substrate 1 is closed with the cover 2 as illustrated in FIG. 1. As a result, the resilient portions 5a of the resilient pressure strips 5 mounted on the cover 2 are located within the grooves 7 of the socket substrate 1 and flexed upwardly by collision with the leads 3a of the electronic device 3 put on the first plate strips 4a of the contacts 4. Thus, the leads 3a are brought into pressure contact with the first plate strips 4a by the restoring force of the resilient portions 5a of the resilient pressure strips 5. Since the first plate strips 4a are supported as the rigid contacts on the bottoms 7a of the grooves 7, they can receive the leads 3a of the electronic device 3 and the resilient portions 5a of the resilient pressure strips 5 without being displaced in the downward direction. The leads 3a of the electronic device 3 are plate-like similarly to the first plate strips 4a of the contacts 4 and, therefore, they are brought into face-to-face contact with the first plate strips 4a. To facilitate the contact pressure, in this embodiment, each of the first plate strips 4a of the contact 4 has a projecting portion 4c. Therefore, the lead 3a is put on the projecting portion 4c and reliably clamped between the contact 4 and the resilient pressure strip 5.

Figure 3:
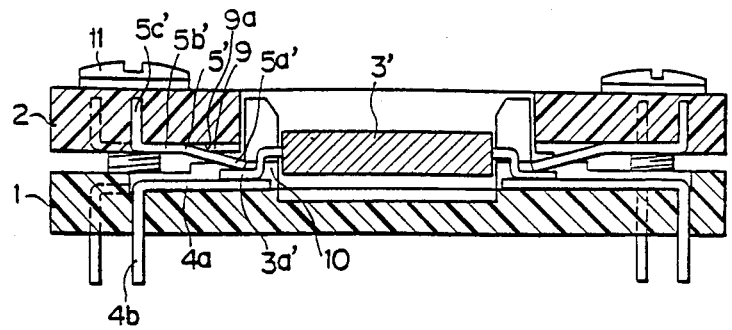
FIG. 3 is a cross-sectional view illustrating the embodiment of FIG. 2 in a state of closing a socket substrate with a cover.
Figure 4:
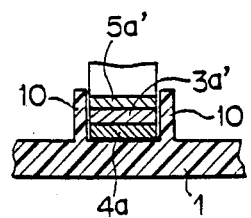
FIG. 4 is a cross-sectional view illustrating a principal part of the embodiment of FIG. 2, wherein a lead of the electronic device is clamped between a contact of the socket substrate and a resilient pressure strip of the cover.
Figure 2:
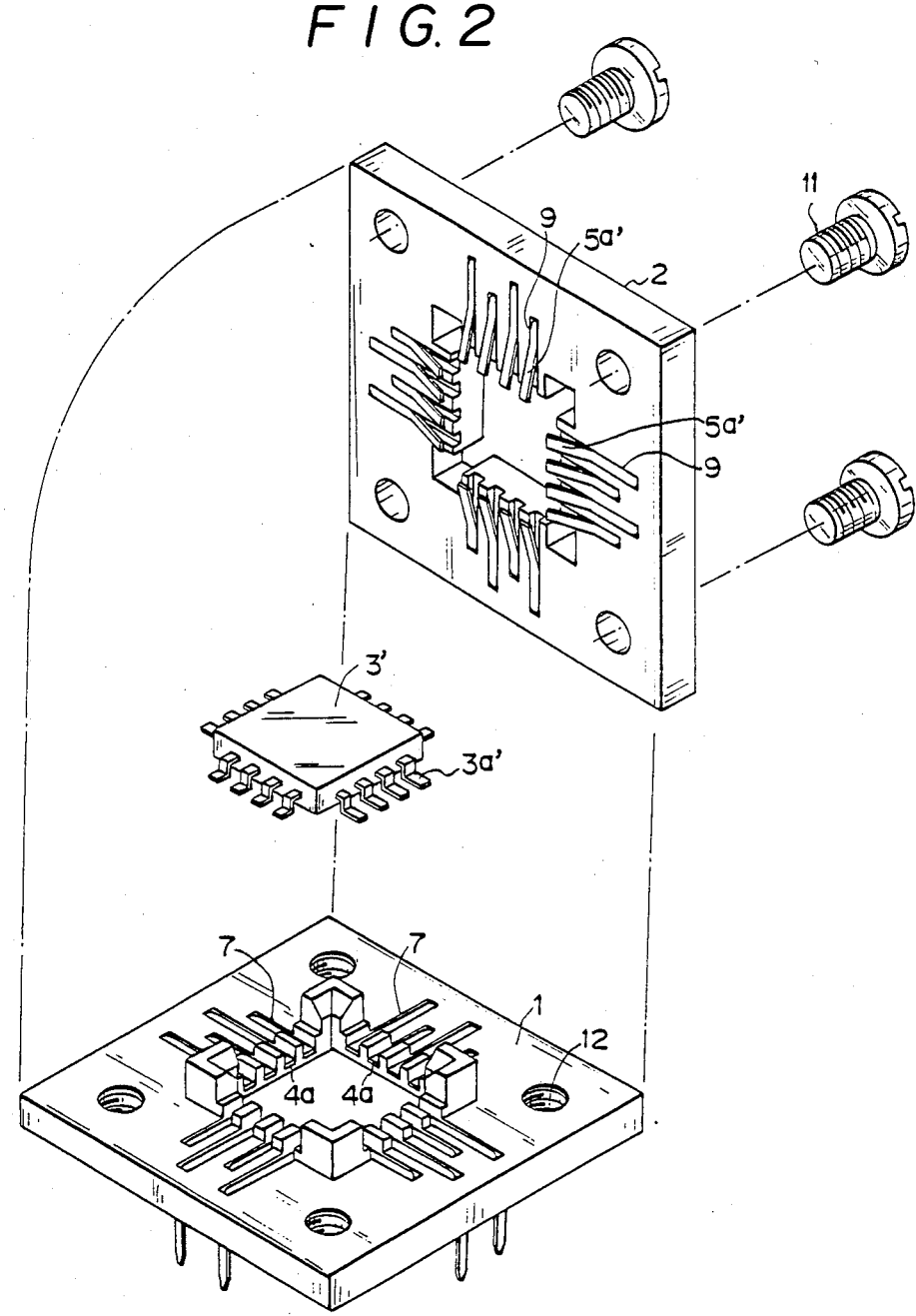
FIG. 2 is an exploded perspective view illustrating another embodiment of the socket for an electronic device according to the present invention.

FIG. 2 through FIG. 4 illustrate another embodiment of the socket for an electronic device according to the present invention. A socket substrate 1 and contacts 4 provided on the socket substrate 1 are identical in fundamental structure with those of the preceding embodiment, respectively.

To be specific, the contacts 4 of the socket substrate 1 of this embodiment are plate members punched out of a strap of plate and are each bent in a substantially L-shape with a fold in the widthwise direction thereof and composed of a first plate strip 4a laid along a groove 7 of the socket substrate 1 for accommodating therein a lead 3a' of an electronic device 3' and supported on and in contact with the bottom 7a of the groove 7 so as to serve as a rigid contact and a second plate strip 4b implanted from the bottom 7a of the groove 7 in the socket substrate 1. The difference between the contacts 4 of the preceding and this embodiments is only that the first plate strip 4a serving as the rigid contact in this embodiment does not have the projecting portion 4c of the preceding embodiment. In this embodiment, therefore, the first plate strip 4a of the contact 4 is brought into intimate contact with the bottom 7a of the groove 7 over the entire length thereof. In this embodiment, there is a possibility of the free ends of the first plate strips 4a of the contacts 4 floating slightly from the bottoms 7a of the grooves 7 due to the manufacturing error. However, such slight floating does not adversely affect the pressure of contact between the contact 4 and the lead 3a' by the action of resilient pressure strips 5' which will be described hereinafter.

The resilient pressure strips 5' are elongate plate members of a uniform width punched out of a strap of plate and are each bent to have a resilient portion 5a', a seat portion 5b' and a leg portion 5c'. The seat portion 5b' and the leg portion 5c' of the resilient pressure strip 5' are integral with each other and cross substantially at right angles, and the former is supported on and in contact with the bottom 9a of a groove 9 formed on one surface of a cover 2 and the latter is implanted from the bottom 9a of the groove 9 in the cover 2. Thus, the resilient pressure strip 5' is retained in its entirety on the cover 2. The resilient portion 5a' and the seat portion 5b' are integral with each other and are bent so that the former inclines downwardly toward the first plate strip 4a of the contact 4 when the cover 2 and the socket substrate 1 have been closed together. Therefore, the resilient portion 5a' of the resilient pressure strip 5' can be resiliently displaced in the vertical direction with the bent portion which is the boundary between the resilient portion 5a' and the seat portion 5b' serving as a fulcrum.

The electronic device 3' is accommodated within a compartment 6 of the socket substrate 1, with the leads 3a' thereof inserted into the grooves 7 and put on the first plate strips 4a of the contacts 4. At this time, the leads put on the first plate strips 4a are disposed near the bottoms 7a of the grooves 7 which are defined by partition walls 10. In this state, the cover 2 and the socket substrate 1 are closed together as illustrated in FIG. 3. As a result, the resilient portions 5a' of the resilient strips 5' have their free ends located within the grooves 7 of the socket substrate 1 and flexed upwardly by collision with the leads 3a' of the electronic device 3' put on the first plate strips 4a of the contacts 4. Thus, the leads 3a' are brought into pressure contact with the first plate strips 4a by the restoring force of the resilient portions 5a' in the same manner as in the preceding embodiment. Since the first plate strips 4a are supported as the rigid contacts on the bottoms 7a of the grooves 7, they can receive the leads 3a' and the resilient portions 5a' without being displaced in the downward direction. Further, since the first plate strips 4a, leads 3a' and resilient portions 5a' are all plate-like, the opposite plate surfaces of the lead 3a' are brought into face-to-face contact with one plate surface of the first plate strip 4a and one plate surface of the resilient portion 5a' respectively as is best shown in FIG. 4. Thus, the lead 3a' can stably clamped between the first plate strip 4a and the resilient portion 5a'. Further, in this embodiment, the state of closing the cover 2 and the socket substrate 1 together is retained by means of bolts 11 which are driven from the side of the cover 2 into fitting holes 12 formed in the socket substrate 1.

According to the present invention, as described above, since the first plate strips of the contacts held in contact with the bottoms of the grooves for accommodating the contacts therein serve as the rigid contacts and since the leads of the electronic device put on the rigid contacts are clamped between the rigid contacts and the resilient pressure strips, it is possible to obtain proper contact pressure, to shorten the length of the signal paths of the contacts, particularly the length of the rigid contacts, thereby effectively preventing an undesirable phenomenon of increase in inductive reactance and capacitive reactance from occurring, to make the level of the contacts and the height of the partition walls defining the contact accommodating grooves as low as possible, to effect processing of the contacts and molding of the socket substrate with great ease, and to provide socket substrates of a small thickness. Further, in the present invention, the contacts can be obtained by punching plate members out of a strap of plate so that the plate members are connected to one another with a common retainer and, in the connected state, the second plate strips of the contacts can be implanted in the socket substrate at the same time. This can enhance the productivity and reduce the manufacturing cost as compared with the conventional sockets requiring the contacts to be implanted one by one in the socket substrate. Differently from the conventional cases where the leads must be put on the contacts projecting to a high level, the present invention makes it possible to stably put the leads on the rigid contacts near the bottoms of the contact accommodating grooves. Thus, the electronic device can easily be set in position. Further, in the present invention, since the rigid contacts are supported on the groove bottoms at the same level, unevenness in contact level of the leads relative to the rigid contacts can be prevented as much as possible.

What is claimed is:

1. A socket for an electronic device having a plurality of leads projecting laterally therefrom, comprising in combination:

a socket substrate having grooves formed on one surface thereof for accommodating therein said plurality of leads and also having contacts which are plate members punched out of a strap of plate and bent in a substantially L-shape with a fold in the widthwise direction and each composed of a first plate strip and a second plate strip with the fold as a boundary, said first plate strip having one surface laid along and supported on a bottom of corresponding one of said grooves to thereby serve as a rigid contact, said second plate strip being implanted from the bottom of the groove in said socket substrate to project downwardly from the lower surface of said socket substrate and serve as a male terminal; and a cover being superposed on and fixed with fastening means to said socket substrate and having resilient pressure strips each resiliently clamping, in cooperation with the other surface of said first plate strip, corresponding one of said plurality of leads of the electronic device accommodated in said grooves of said socket substrate;

whereby pressure of contact between said plurality of leads of said electronic device and said contacts of said socket substrate is obtained.

2. A socket for an electronic device according to claim 1, wherein said first plate strip of each of the contacts has a projecting portion to clamp each of said plurality of leads in cooperation with each of said resilient pressure strips.

3. A socket for an electronic device according to claim 1, wherein said cover has grooves formed on an inner surface thereof for admitting said resilient pressure strips, and each of said resilient pressure strips is composed of a resilient portion and a seat portion forming a substantially U-shape in conjunction with each other and a leg portion integral with and disposed substantially at right angles relative to said seat portion, said leg portion being implanted in said cover from a bottom of the groove of the cover, said seat portion being accommodated within the groove and kept in intimate contact with the bottom of the groove of said cover, and said resilient portion being adapted to resiliently clamp each of said plurality of leads in cooperation with said first plate strip of each of said contacts.

* * * * *